United States Patent
Kobayashi et al.

(10) Patent No.: US 10,249,547 B2
(45) Date of Patent: Apr. 2, 2019

(54) METHOD FOR USING A TEST WAFER BY FORMING MODIFIED LAYER USING A LASER BEAM AND OBSERVING DAMAGE AFTER FORMING MODIFIED LAYER

(71) Applicant: DISCO CORPORATION, Tokyo (JP)

(72) Inventors: Satoshi Kobayashi, Tokyo (JP); Shunsuke Teranishi, Tokyo (JP); Nobumori Ogoshi, Tokyo (JP); Atsushi Ueki, Tokyo (JP); Yuriko Sato, Tokyo (JP); Yasuhiro Shimma, Tokyo (JP)

(73) Assignee: DISCO CORPORTATION, Tokyo (JP)

( * ) Notice: Subject to any disclaimer, the term of this patent is extended or adjusted under 35 U.S.C. 154(b) by 17 days.

(21) Appl. No.: 15/220,886

(22) Filed: Jul. 27, 2016

(65) Prior Publication Data
US 2017/0040235 A1    Feb. 9, 2017

(30) Foreign Application Priority Data

Aug. 7, 2015    (JP) .................................. 2015-157185

(51) Int. Cl.
*H01L 21/66* (2006.01)
(52) U.S. Cl.
CPC .............. *H01L 22/30* (2013.01); *H01L 22/12* (2013.01)
(58) Field of Classification Search
CPC .............................. H01L 22/30; H01L 22/12
See application file for complete search history.

(56) References Cited

U.S. PATENT DOCUMENTS

| | | | | |
|---|---|---|---|---|
| 2005/0127299 A1* | 6/2005 | Nagai | ................. | G03F 7/70608 250/358.1 |
| 2012/0262715 A1* | 10/2012 | Sakai | ..................... | G01N 21/21 356/369 |
| 2012/0307236 A1* | 12/2012 | Ortner | ................ | G01N 21/9505 356/239.3 |
| 2013/0017640 A1* | 1/2013 | Morikazu | .............. | B23K 26/00 438/46 |
| 2013/0037825 A1* | 2/2013 | Hiraiwa | .............. | H01L 33/0095 257/79 |
| 2014/0038392 A1* | 2/2014 | Yonehara | .............. | H01L 21/304 438/463 |
| 2014/0322847 A1* | 10/2014 | Endo | ...................... | B23K 26/40 438/33 |

(Continued)

FOREIGN PATENT DOCUMENTS

| | | |
|---|---|---|
| JP | 2002-192370 | 7/2002 |
| JP | 2015-085376 | 5/2015 |

*Primary Examiner* — Michael Jung
(74) *Attorney, Agent, or Firm* — Greer Burns & Crain, Ltd.

(57) ABSTRACT

Disclosed herein is a using method for a test wafer including a test substrate and a metal foil formed on the front side of the test substrate. The using method includes a modified layer forming step of applying a laser beam having a transmission wavelength to the test substrate from the back side of the test wafer in the condition where the focal point of the laser beam is set inside the test substrate, thereby forming a modified layer inside the test substrate, and a damage detecting step of observing the front side of the test wafer after performing the modified layer forming step, thereby detecting damage to the metal foil.

8 Claims, 5 Drawing Sheets

(56) References Cited

U.S. PATENT DOCUMENTS

2015/0194232 A1* 7/2015 Matsuura ............... H01B 1/026
  257/98
2016/0011122 A1* 1/2016 Pacheco ............. G01N 21/9505
  356/369

* cited by examiner

METHOD FOR USING A TEST WAFER BY FORMING MODIFIED LAYER USING A LASER BEAM AND OBSERVING DAMAGE AFTER FORMING MODIFIED LAYER

BACKGROUND OF THE INVENTION

Field of the Invention

The present invention relates to a test wafer for use in examining the effect of leaky light of a laser beam in forming a modified layer inside a substrate of an actual wafer along each division line, and also relates to a using method for this test wafer.

Description of the Related Art

A plurality of devices such as integrated circuits (ICs), large-scale integrations (LSIs), light-emitting diodes (LEDs), microelectromechanical systems (MEMSs), and complementary metal-oxide semiconductors (CMOSs) are formed on the front side of a wafer so as to be separated by a plurality of crossing division lines. The wafer having the devices on the front side is divided along the division lines into individual device chips by using a laser processing apparatus. The device chips (substrate device chips) thus obtained are packaged and then used in electronic equipment such as mobile phones and personal computers.

For example, the laser processing apparatus includes a chuck table for holding the wafer, laser beam applying means for applying a laser beam having a transmission wavelength to the wafer in the condition where the focal point of the laser beam is set inside the wafer in an area below each division line, thereby forming a modified layer inside the wafer, and feeding means for relatively feeding the chuck table and the laser beam applying means, whereby the modified layer as a division start point for dividing the wafer into the individual device chips can be formed with high accuracy (see Japanese Patent No. 3408805, for example).

The wafer having the devices to be divided by the laser processing apparatus is composed of a substrate and a functional layer formed on the front side of the substrate, the functional layer forming the devices. Accordingly, the laser beam is applied to the wafer from the back side thereof in the condition where the focal point of the laser beam is set inside the wafer at a predetermined depth from the back side of the wafer (substrate). At this time, there is a possibility that a part of the laser beam does not contribute to the formation of the modified layer, but is transmitted as leaky light through the substrate to reach the front side of the wafer, wherein the devices formed on the front side of the wafer may be possibly damaged by this leaky light, depending on the laser processing conditions adopted in applying the laser beam or the angle of transmission of the leaky light in the substrate (see Japanese Patent Laid-Open No. 2015-085376, for example).

SUMMARY OF THE INVENTION

The present inventor has further examined the cause of damage to the devices in performing the laser processing using the laser processing apparatus. As the result of this examination, the following problem has been found out. A part of the laser beam applied to the wafer in the laser processing apparatus is simply transmitted through the wafer (substrate) to reach the front side of the wafer in an area along each division line present directly below the focal point of the laser beam, thus causing damage to the devices. In addition, this part of the laser beam may be reflected, refracted, or scattered in an unexpected direction by the modified layer or cracks formed in the vicinity of the modified layer to reach another area where the devices are formed by the functional layer. That is, this part of the laser beam is transmitted as deflected light through the wafer (substrate) to reach the front side of the wafer, causing damage to a part of each device, e.g., a wiring layer included in each device.

Further, in performing the laser processing using the laser processing apparatus without causing a reduction in quality of each device, it is necessary to examine the degree of effect on the functional layer forming the devices due to the leaky light in connection with the laser processing conditions to be adopted in applying the laser beam according to the material, thickness, etc. of the wafer as a workpiece.

However, damage to the devices formed on the front side of the wafer due to the leaky light is caused inside the wafer as a workpiece. Accordingly, in the case of examining the effect of the leaky light by using the wafer as an actual workpiece, it is not easy to check the condition of damage inside the wafer from the outside thereof. Accordingly, it is difficult to set various conditions in the laser processing apparatus as avoiding the laser processing conditions causing damage to a part of the functional layer formed on the front side of the wafer.

It is therefore an object of the present invention to provide a test wafer and a using method therefor which can easily examine the effect of leaky light of a laser beam according to the laser processing conditions in performing laser processing to an actual wafer including a substrate and a plurality of devices formed on the front side of the substrate so as to be separated by a plurality of crossing division lines, the laser beam having a transmission wavelength to the substrate being applied to the actual wafer from the back side thereof along each division line to thereby form a modified layer inside the substrate along each division line.

The term of "leaky light" used in the present invention includes laser light that does not contribute to the formation of the modified layer to be formed in the vicinity of the focal point to be set inside the actual wafer, but is transmitted through the substrate to reach the front side of the wafer in performing laser processing using a laser processing apparatus for applying the laser beam to the actual wafer from the back side thereof along each division line to thereby form the modified layer inside the substrate along each division line. That is, the leaky light includes laser light reaching an area on the front side of the actual wafer along each division line formed directly below the modified layer and also includes deflected light generated by the reflection, refraction, or scattering of the laser beam at the modified layer or the cracks formed near the modified layer to reach an area on the front side of the actual layer other than the above-mentioned area along each division line.

In accordance with an aspect of the present invention, there is provided a test wafer for use in examining the effect of leaky light of a laser beam in performing laser processing to an actual wafer including a substrate and a plurality of devices formed on a front side of the substrate so as to be separated by a plurality of crossing division lines, the laser beam having a transmission wavelength to the substrate being applied to the actual wafer from a back side thereof along each division line to thereby form a modified layer inside the substrate along each division line. The test wafer includes a test substrate, and a metal foil formed on a front side of the test substrate.

Preferably, the test wafer further includes a base layer formed on the front side of the test substrate, the base layer being formed of Ti or Cr. The metal foil is formed on the front side of the base layer and is formed of Al, Sn, Pt, Au, Ag, In, Pb, or Cu. Preferably, the test substrate is formed of Si, SiC, $Al_2O_3$, or GaN.

Preferably, the metal foil is formed on the whole of the front side of the test substrate or on the front side of the test substrate so as to form a dot pattern, lattice pattern, rectangular pattern, or stripe pattern. Preferably, the test wafer further includes an oxidation preventing film formed on the front side of a metal foil. The oxidation preventing film is formed of $SiO_2$, $TiO_2$, $Ta_2O_5$, or polyethylene terephthalate (PET).

In accordance with another aspect of the present invention, there is provided a test wafer using method for using a test wafer including a test substrate and a metal foil formed on a front side of the test substrate. The test wafer using method includes a modified layer forming step of applying a laser beam having a transmission wavelength to the test substrate from a back side of the test wafer in the condition where a focal point of the laser beam is set inside the test substrate, thereby forming a modified layer inside the test substrate. The test wafer using method further includes a damage detecting step of observing a front side of the test wafer after performing the modified layer forming step, thereby detecting damage to the metal foil.

According to the present invention, the laser beam is applied to the test wafer from the back side thereof in the condition where the focal point of the laser beam is set inside the test substrate under the laser processing conditions to be actually adopted, and the presence/absence and size of damage to the metal foil formed on the front side of the test wafer are checked to thereby easily grasp any laser processing conditions causing the effect of the leaky light not used for the formation of the modified layer, the effect of the leaky light being such that the leaky light may break the devices formed on the front side of the actual wafer. Further, by performing the test wafer using method of the present invention, the laser processing conditions can be easily adjusted to proper processing conditions under which a good modified layer can be formed inside the actual wafer and no leaky light is generated to prevent a reduction in quality of each device.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
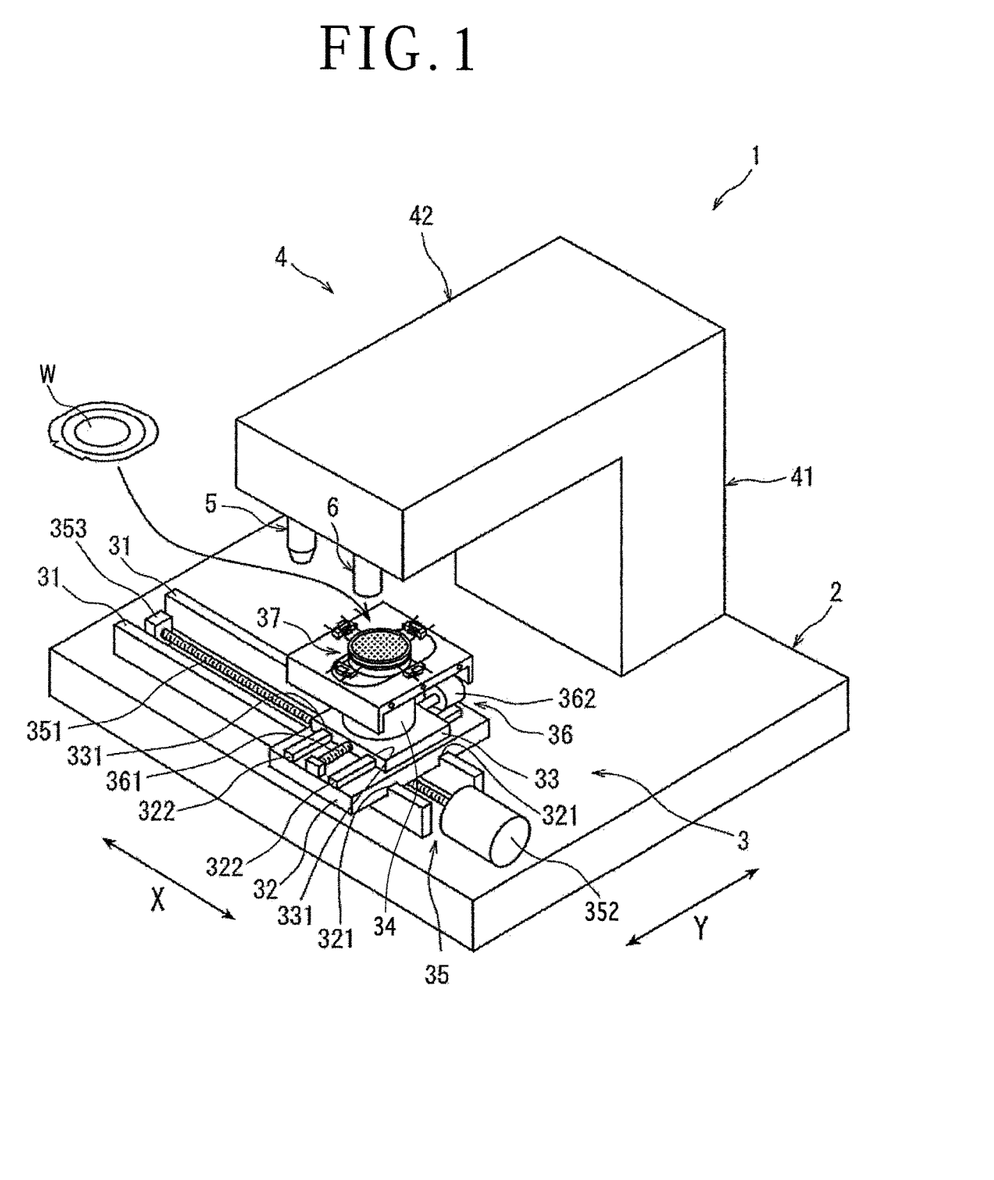
FIG. 1 is a perspective view of a laser processing apparatus.

FIG. 1 is a perspective view of a laser processing apparatus 1 which can perform the test wafer using method according to the present invention. The laser processing apparatus 1 shown in FIG. 1 includes a stationary base 2, a holding table mechanism 3 for holding a workpiece, the holding table mechanism 3 being provided on the stationary base 2 so as to be movable in an X direction (feeding direction) shown by an arrow X, and a laser beam applying unit 4 as laser beam applying means provided on the stationary base 2.

The holding table mechanism 3 includes a pair of guide rails 31 provided on the stationary base 2 so as to extend parallel to each other in the X direction, a first slide block 32 provided on the guide rails 31 so as to be movable in the X direction, a second slide block 33 provided on the first slide block 32 so as to be movable in a Y direction (indexing direction) shown by an arrow Y perpendicular to the X direction, and a cylindrical holding table 34 provided on the second slide block 33 so as to be rotatable by an internal pulse motor (not shown). The holding table 34 has an upper surface as a holding surface, or a chuck table 37. In the laser processing apparatus 1 shown in FIG. 1, a workpiece such as a semiconductor wafer (not shown) having devices formed on the front side or a test wafer W formed by the present invention is placed on the chuck table 37.

The lower surface of the first slide block 32 is formed with a pair of guided grooves 321 for slidably engaging the pair of guide rails 31 mentioned above. A pair of guide rails 322 are provided on the upper surface of the first slide block 32 so as to extend parallel to each other in the Y direction. Accordingly, the first slide block 32 is movable in the X direction along the guide rails 31 by the slidable engagement of the guided grooves 321 with the guide rails 31. The holding table mechanism 3 further includes X moving means 35 as feeding means for moving the first slide block 32 in the X direction along the guide rails 31. The X moving means 35 includes an externally threaded rod 351 extending parallel to the guide rails 31 so as to be interposed therebetween and a pulse motor 352 as a drive source for rotationally driving the externally threaded rod 351. The externally threaded rod 351 is rotatably supported at one end thereof to a bearing block 353 fixed to the stationary base 2 and is connected at the other end to the output shaft of the pulse motor 352 so as to receive the torque thereof. The externally threaded rod 351 is engaged with a tapped through hole formed in an internally threaded block (not shown) projecting from the lower surface of the first slide block 32 at a central portion thereof. Accordingly, the first slide block 32 is moved in the X direction along the guide rails 31 by operating the pulse motor 352 to normally or reversely rotate the externally threaded rod 351.

The lower surface of the second slide block 33 is formed with a pair of guided grooves 331 for slidably engaging the pair of guide rails 322 provided on the upper surface of the first slide block 32 as mentioned above. Accordingly, the second slide block 33 is movable in the Y direction along the guide rails 322 by the slidable engagement of the guided grooves 331 with the guide rails 322. The holding table mechanism 3 further includes Y moving means 36 as indexing means for moving the second slide block 33 in the Y direction along the guide rails 322. The Y moving means 36 includes an externally threaded rod 361 extending parallel to the guide rails 322 so as to be interposed therebetween and a pulse motor 362 as a drive source for rotationally driving the externally threaded rod 361. The externally threaded rod 361 is rotatably supported at one end thereof to a bearing block 363 fixed to the upper surface of the first slide block 32 and is connected at the other end to the output shaft of the pulse motor 362 so as to receive the torque thereof. The externally threaded rod 361 is engaged with a tapped through hole formed in an internally threaded block (not shown) projecting from the lower surface of the second slide block 33 at a central portion thereof. Accordingly, the second slide block 33 is moved in the Y direction along the guide rails 322 by operating the pulse motor 362 to normally or reversely rotate the externally threaded rod 361.

The first slide block 32 is provided with X position detecting means (not shown) for detecting the X position of the first slide block 32 in the X direction. Similarly, the second slide block 33 is provided with Y position detecting means (not shown) for detecting the Y position of the second slide block 33 in the Y direction. Control means to be described later transmits drive signals to the pulse motors 352 and 362 according to the X position of the first slide block 32 and the Y position of the second slide block 33 detected above, thereby controlling the position (X-Y position) of the holding table 34 to a desired position.

The laser beam applying unit 4 includes a support member 41 provided on the stationary base 2, a casing 42 supported to the support member 41 so as to extend in a substantially horizontal direction, laser beam applying means 5 provided in connection with the casing 42, and imaging means 6 provided at the front end portion of the casing 42 for detecting a subject area of the workpiece to be laser-processed by the laser beam applying means 5. The imaging means 6 includes illuminating means for illuminating the workpiece, an optical system for capturing an area illuminated by the illuminating means, and an imaging device (charge-coupled device (CCD)) for imaging the area captured by the optical system. An image signal output from the imaging means 6 is transmitted to the control means (not shown) to be described later.

The laser beam applying means 5 includes laser beam oscillating means (not shown) provided in the casing 42 for oscillating a pulsed laser beam and focusing means (not shown) provided at the front end portion of the casing 42 for focusing the pulsed laser beam oscillated by the laser beam oscillating means and applying this pulsed laser beam to the workpiece held on the chuck table 37. Although not shown, the laser beam oscillating means includes power adjusting means for adjusting the power of the pulsed laser beam, a laser oscillator for oscillating the pulsed laser beam, and repetition frequency setting means for setting the repetition frequency of the pulsed laser beam. The laser beam applying means 5 further includes focal position adjusting means (not shown) for adjusting the focal position of the pulsed laser beam in a direction perpendicular to the holding surface (upper surface) of the holding table 34.

The laser processing apparatus 1 further includes control means (not shown). This control means is configured by a computer, and it includes a central processing unit for performing operational processing according to a control program, a read only memory (ROM) preliminarily storing the control program, a random access memory (RAM) for storing the results of computation, etc., an input interface, and an output interface. Detection signals from the X position detecting means, the Y position detecting means, and the imaging means 6 are input into the input interface of the control means. On the other hand, control signals are output from the output interface of the control means to the X moving means, the Y moving means, the focal position adjusting means, and the power adjusting means.

In the laser processing apparatus 1, laser processing conditions in performing laser processing to a wafer having a plurality of devices formed on the front side can be freely set. A plurality of crossing division lines are formed on the front side of the wafer to define a plurality of separate regions where the plural devices are individually formed. The laser processing is performed by applying a laser beam to the wafer from the back side thereof along the division lines whose data has been previously stored in the memory of the control means, thereby forming a modified layer inside the wafer along each division line, wherein the modified layer is formed as a division start point for the division of the wafer into the individual devices. The laser processing conditions include the wavelength of the laser beam, the average power of the laser beam, the repetition frequency of the laser beam, the pulse width of the laser beam, the numerical aperture (NA) of a focusing lens included in the focusing means, the focal position of the laser beam, and the relative feed speed between the laser beam applying means 5 and the holding table 34.

The laser processing conditions in the laser processing apparatus 1 are set in consideration of, for example, the material and thickness of the wafer to be used, the width of each division line between the devices formed on the front side of the wafer, or processing conditions used in the past processing record. However, the laser processing conditions that can form the modified layer more reliably may cause a reduction in quality of each device (device chip) obtained by dividing the wafer due to the effect of leaky light. Accordingly, in the case of using a new wafer or adopting new processing conditions, it is necessary to check whether or not the processing conditions to be adopted may cause a reduction in quality of each device, prior to adjusting the processing conditions. There will now be described the test wafer W suitable for use in checking whether or not the processing conditions in the laser processing apparatus 1 are proper, according to the present invention. A using method for the test wafer W will also be described.

Figure 2A:
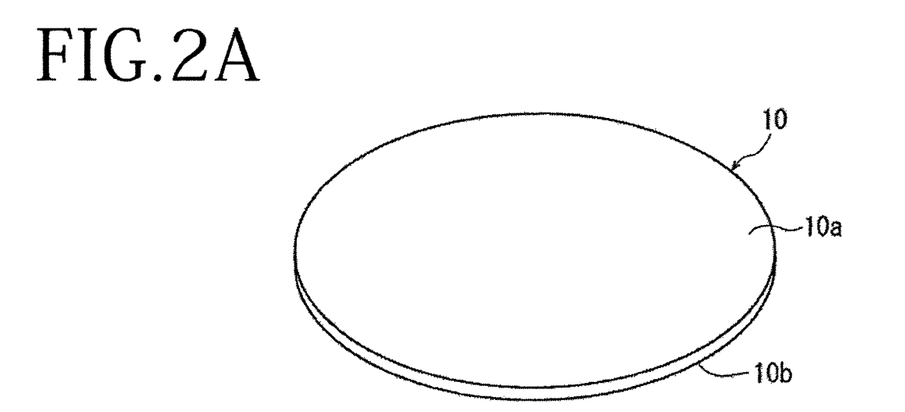
FIGS. 2A to 2C are perspective views for illustrating a manufacturing method for a test wafer according to a preferred embodiment of the present invention.

A manufacturing method for the test wafer W will now be described with reference to FIGS. 2A to 2C. FIG. 2A shows a test substrate 10 constituting the test wafer W, wherein the test substrate 10 has a front side 10a and a back side 10b. The material of the test substrate 10 may be selected from various materials. However, the material of the test substrate 10 is to be the same material as that of the actual wafer having the devices. For example, when the substrate of the actual wafer is formed of Si, the material of the test substrate 10 is set to Si. The thickness of the test substrate 10 is adjusted to the same as the thickness of the substrate of the actual wafer. Examples of the material of the test substrate 10 include Si, SiC, $Al_2O_3$, and GaN.

Figure 2B:
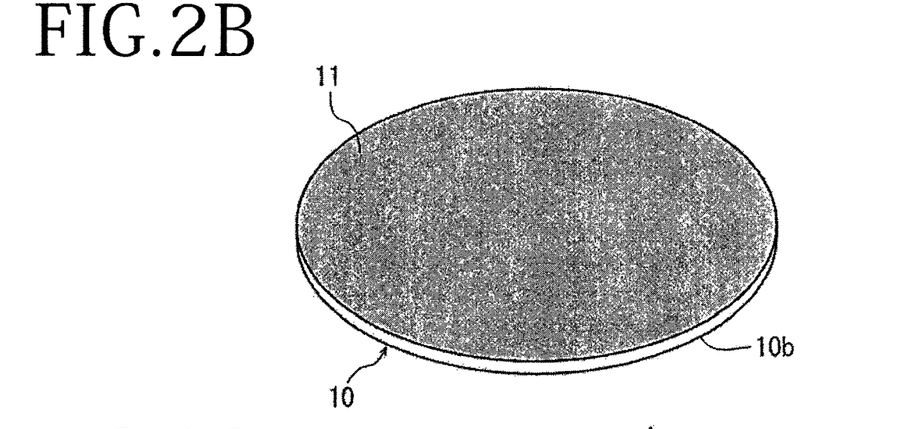

As shown in FIG. 2B, a base layer 11 is formed by evaporation on the whole of the front side 10a of the test substrate 10. The material of the base layer 11 is typically selected from Ti and Cr. As an evaporation method, ion plating known in the art may be selected. However, any other evaporation methods such as sputtering may also be selected. The base layer 11 is formed, so as to well form a metal foil on the test substrate 10 by evaporation, the metal foil being required in examining the effect of leaky light to be hereinafter described. However, the base layer 11 may be omitted, provided that the metal foil can be directly formed on the test substrate 10. The thickness of the base layer 11 is suitably selected in the range of 50 nm to 500 nm.

Figure 2C:
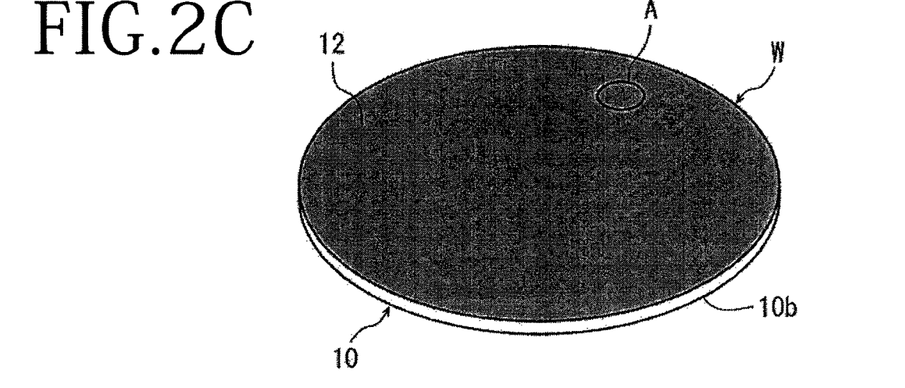

As shown in FIG. 2C, a metal foil 12 is formed by evaporation on the whole of the front side (upper surface) of the base layer 11. Examples of the material of the metal foil 12 include Sn, Al, Pt, Au, Ag, In, Pb, and Cu. The thickness of the metal foil 12 is suitably selected in the range of 50 nm to 500 nm as similar to the base layer 11. The material of the metal foil 12 is decided in consideration of the melting point of the metal forming a wiring layer used in each device formed on the actual wafer. In other words, the metal foil 12 functions as a substitute for the devices formed on the actual wafer, and it is unnecessary to actually form devices on the test substrate 10.

For example, as the material of a wiring layer in a general semiconductor device, Al is most adopted and the melting point of Al is approximately 660° C. Accordingly, in the case of examining damage to a wiring portion of an actual wafer using Al as the material of the wiring layer, any metal having a melting point equal to or lower than the melting point of Al is preferably used as the material of the metal foil 12. In this preferred embodiment, Sn having a melting point of 220° C. is adopted as such a metal. Accordingly, when heat load at temperatures of 220° C. or higher is applied to the metal foil 12, melting occurs on the metal foil 12 and it is possible to determine whether or not the devices of the actual wafer may be damaged under the laser processing conditions examined in this preferred embodiment. This point will be described in more detail with reference to FIGS. 4A to 5.

Figure 4A:
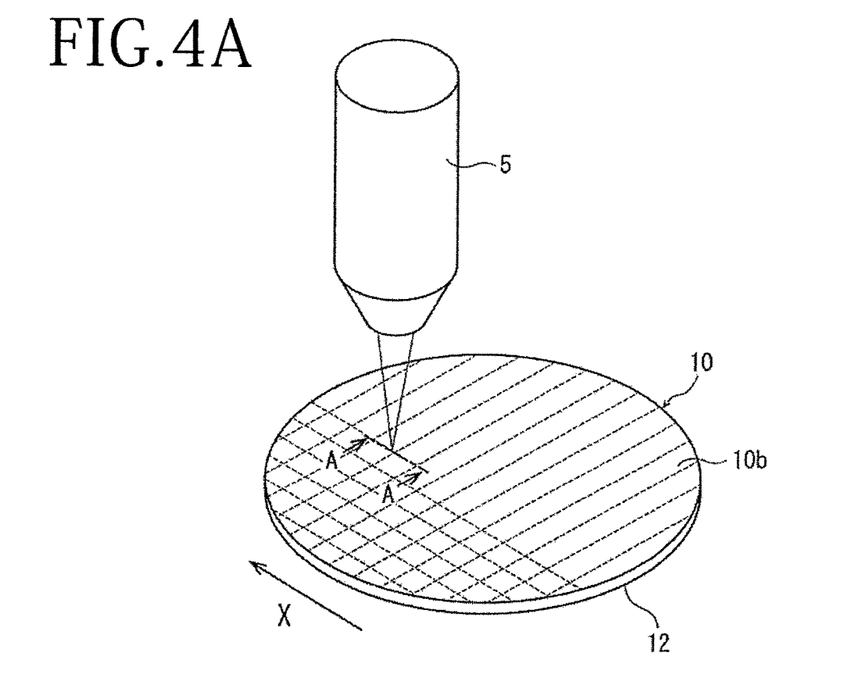
FIG. 4A is a perspective view for illustrating a modified layer forming step.
Figure 4B:
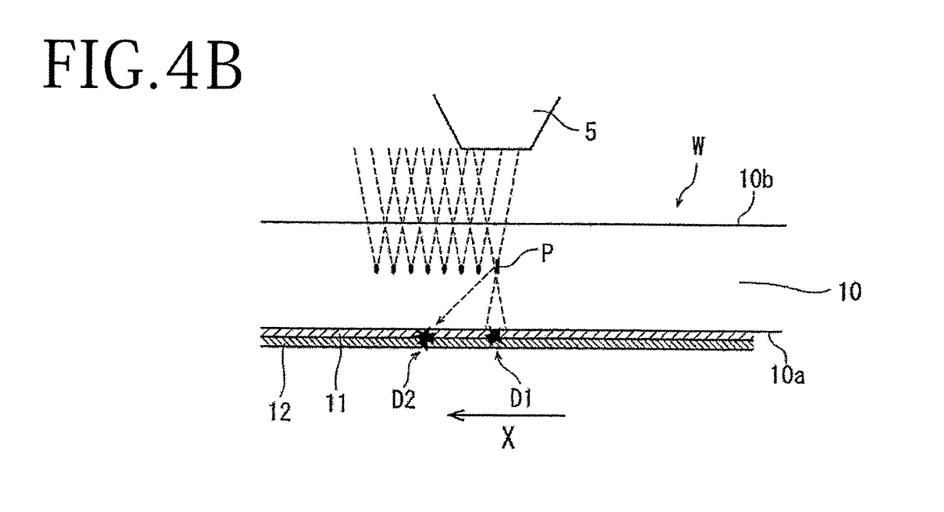
FIG. 4B is an enlarged cross section taken along the line A-A in FIG. 4A.

As shown in FIG. 4A, laser processing is performed to the test wafer W under the laser processing conditions similar to those for the actual wafer, thereby forming a modified layer inside the test wafer W along an imaginary line corresponding to each division line of the actual wafer (modified layer forming step). More specifically, the laser beam applying means 5 is operated to apply a laser beam to the test wafer W held on the chuck table 37 constituting the holding table 34 in the condition where the back side 10b of the test substrate 10 is oriented upward. Further, the feeding means is operated to sequentially move the holding table 34 holding the test wafer W in the X direction. Further, the indexing means is operated to stepwise move the holding table 34 in the Y direction with the pitch of a plurality of first division lines extending in the X direction. As a result, a plurality of modified layers are formed inside the test wafer W along the first division lines. Thereafter, the holding table 34 is rotated 90 degrees to similarly form a plurality of modified layers inside the test wafer W along a plurality of second division lines perpendicular to the first division lines.

The modified layer forming step mentioned above is performed under the following laser processing conditions, for example.

| | |
|---|---|
| Wavelength of laser beam | 1064 nm |
| Repetition frequency | 50 kHz |
| Pulse width | 10 ps |
| Average power | 0.5 W |
| Spot diameter | 1 μm |
| Numerical aperture (NA) of focusing lens | 0.85 |
| Work feed speed | 100 nm/second |

The effect of leaky light in the modified layer forming step will now be described with reference to FIG. 4B. As shown in FIG. 4B, the focal point of the laser beam to be applied from the laser beam applying means 5 is set inside the test substrate 10 of the test wafer W, and each modified layer is formed in the vicinity of the focal point. At this time, all the energy of the laser beam does not always form each modified layer, but there is a case that a part of the laser beam as leaky light may reach the area on the front side 10a of the test substrate 10 directly below the focal point of the laser beam, the front side 10a being held through the base layer 11 and the metal foil 12 on the chuck table 37 (see symbol D1 in FIG. 4B). Depending on the conditions of the laser beam that has reached the front side 10a of the test substrate 10 as leaky light, the laser beam is absorbed in this area on the front side 10a of the test substrate 10, causing heat generation. In the case that the amount of heat generated is large, this area is melted in the metal foil 12 of the test wafer W by the leaky light of the laser beam as shown by the symbol D1. The temperature condition for melting of the metal foil 12 at this time changes according to the kind, pattern, and thickness of the metal foil 12.

Further, in the case that the modified layers have already been formed in the direction perpendicular to the feeding direction (see point P in FIG. 4B), the laser beam is relatively moved in the X direction to pass the modified layer P already formed, and at this time the laser beam may be reflected (or refracted or scattered) by cracks generated inside the test substrate 10 in forming the modified layer P or by the modified layer P itself. This laser beam reflected may be transmitted as deflected light through the test substrate 10 in an unexpected direction to reach the front side 10a of the test substrate 10 (see symbol D2 in FIG. 4B). As similar to the case of the symbol D1, depending on the conditions of the laser beam that has reached the front side 10a of the test substrate 10 as deflected light, the laser beam is absorbed in this area on the front side 10a of the test substrate 10, causing heat generation. In the case that the amount of heat generated is large, this area is melted in the metal foil 12 of the test wafer W by the deflected light of the laser beam as shown by the symbol D2.

After performing the modified layer forming step as mentioned above, the test wafer W is removed from the chuck table 37, and any melted portion of the metal foil 12 is observed to detect damage to the metal foil 12 (damage detecting step).

Figure 5:
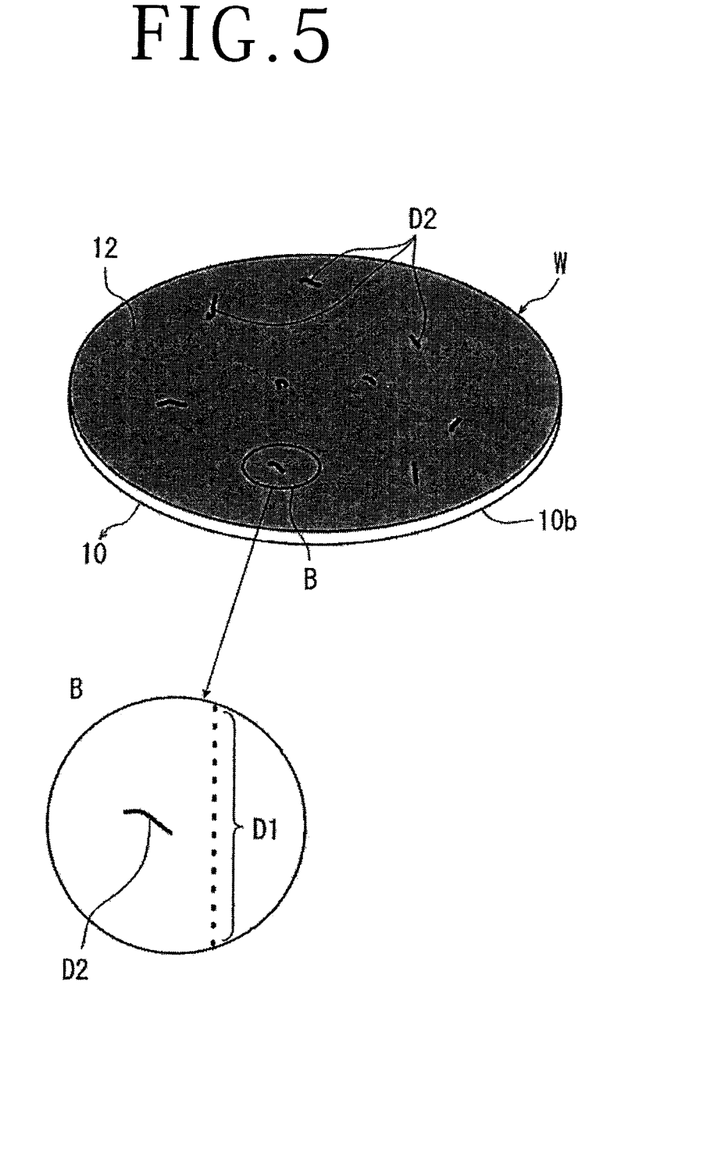
FIG. 5 is a perspective view showing damage generated on the test wafer in performing the modified layer forming step.

As shown in FIG. 5, the damage D1 or D2 due to melting of the metal foil 12 by the laser processing can be detected by observing the front side of the test wafer W where the metal foil 12 is formed. As shown in an enlarged view of an encircled part B in FIG. 5, the damage D1 caused by the leaky light transmitted directly below the focal point of the laser beam is linearly generated along each division line. Accordingly, it is determined whether or not the width of the linear damage D1 falls within the width of each division line. If the width of the linear damage D1 is greater than the width of each division line, it can be said that the linear damage D1 may cause damage to the adjacent devices of the actual wafer. In the perspective view of the test wafer W in FIG. 5, the damage D1 along each division line is not shown.

On the other hand, there is a high possibility that the damage D2 caused by the deflected light due to the reflection (or refraction or scattering) of the laser beam by the modified layer P or the cracks formed in the vicinity of the modified layer P may be generated in the area outside each division line of the actual wafer where the devices are formed. That is, in the case that the damage D2 due to the deflected light is detected, it shows that the devices of the actual wafer may be damaged by the laser beam under the same laser processing conditions, regardless of the size of the damage D2.

In this manner, by performing the laser processing to the test wafer W and then observing the size and frequency of occurrence of the damage due to the leaky light on the front side of the test wafer W, it can be easily predicted possible damage to the devices of the actual wafer with high accuracy.

After performing the damage detecting step as mentioned above, at least one of the various processing conditions of the laser processing using the laser processing apparatus is adjusted (processing conditions adjusting step). Examples of the processing conditions include the wavelength of the laser beam, the average power of the laser beam, the repetition frequency of the laser beam, the pulse width of the laser beam, the numerical aperture (NA) of the focusing lens, the focal position of the laser beam, and the relative feed speed of the test wafer W. After adjusting the laser processing conditions, the laser processing is performed again to the test wafer W, so that modified layers can be formed in the test wafer W without causing damage to the metal foil 12. Accordingly, in the case of performing the laser processing to the actual wafer having the devices under the laser processing conditions adjusted above, possible damage to the devices can be reduced.

Figure 3A:
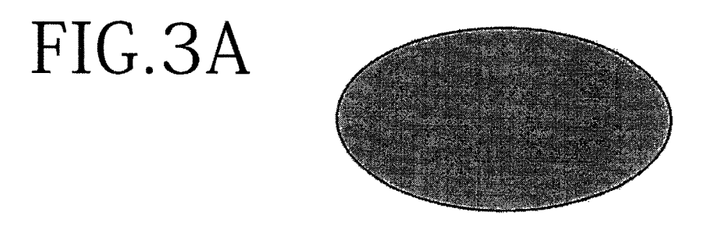
FIGS. 3A to 3E are perspective views showing various patterns of a metal foil to be formed on the front side of a test substrate.
Figure 3B:
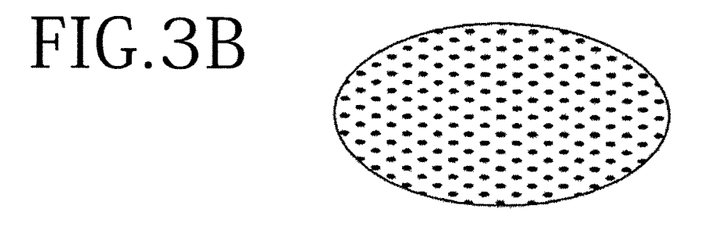
Figure 3C:
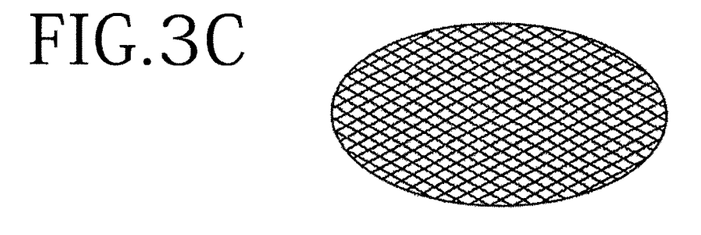
Figure 3D:
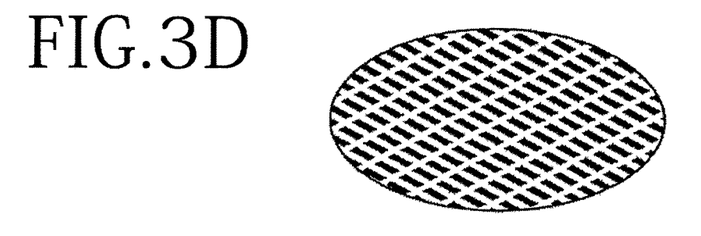
Figure 3E:
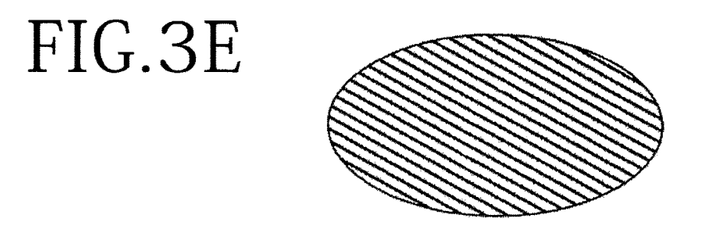

While the metal foil 12 of the test wafer W is formed on the whole of the front side of the base layer 11 in the preferred embodiment, various modifications may be made for the pattern of the metal foil 12. FIG. 3A is an enlarged view of an encircled part A in FIG. 2C according to the preferred embodiment. FIGS. 3B to 3E show various modifications of the pattern shown in FIG. 3A. More specifically, FIG. 3B shows a dot pattern, FIG. 3C shows a lattice pattern, FIG. 3D shows a rectangular pattern, and FIG. 3E shows a stipe pattern. Each of these patterns shown in FIGS. 3B to 3E has regularly arranged blank portions where the metal foil 12 is not formed. In the case of the solid pattern shown in FIG. 3A, there is a possibility that even when the temperature of a part of the metal foil locally rises due to the leaky light, the heat generated is conducted from this part to a peripheral portion, so that the damage due to melting is less prone to generate. To the contrary, in the case of the patterns shown in FIGS. 3B to 3E, such heat conduction can be suppressed and the damage due to melting is therefore prone to generate. Further, the pattern shown in FIG. 3A and at least one of the patterns shown in FIGS. 3B to 3E may be suitably combined on a single test wafer. The patterns shown in FIGS. 3B to 3E can be easily formed by a known method using a photomask and etching in combination.

As described above, the conditions of generation of the damage change according to the condition of heat conduction in the metal foil 12 of the test wafer W. Accordingly, the thinner the metal foil 12, the more easily the damage is generated, whereas the thicker the metal foil 12, the less easily the damage is generated. That is, the thickness of the metal foil 12 is selected in consideration of the material of the metal foil 12, depending on the conditions (allowable limit temperature in each device) as required in the test wafer according to the actual wafer.

Optionally, an oxidation preventing film may be formed on the front side of the metal foil 12 of the test wafer W. Examples of the material forming the oxidation preventing film include $SiO_2$, $TiO_2$, $Ta_2O_5$, and PET. By forming the oxidation preventing film, unwanted oxidation of the metal foil 12 can be prevented even when a long period of time has elapsed after the production of the test wafer W.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A test wafer using method for using a test wafer including a test substrate and a metal foil formed on a front side of said test substrate, said test wafer using method comprising:
    a modified layer forming step of applying a laser beam having a transmission wavelength to said test substrate from a back side of said test wafer in the condition where a focal point of said laser beam is set inside said test substrate, thereby forming a modified layer inside said test substrate;
    a damage detecting step of observing a front side of said test wafer after performing said modified layer forming step, thereby detecting damage to said metal foil; and
    a processing conditions adjusting step of adjusting at least one of the laser processing conditions adopted in said modified layer forming step according to the result of detection of said damage obtained in said damage detecting step, said at least one of the laser processing conditions being selected from the group consisting of the wavelength of said laser beam, average power of said laser beam, repetition frequency of said laser beam, pulse width of said laser beam, numerical aperture of a focusing lens for focusing said laser beam, focal position of said laser beam, and relative feed speed of said test wafer.

2. The test wafer using method according to claim 1, wherein the test wafer includes:
    a base layer formed on the front side of said test substrate, the material of said base layer being selected from the group consisting of Ti and Cr,
    the material of said metal foil being formed on the front side of said base layer and being selected from the group consisting of Al, Sn, Pt, Au, Ag, In, Pb, and Cu.

3. The test wafer using method according to claim 2, wherein said metal foil is formed on the whole of the front side of said test substrate, said metal foil having a melting point lower than or equal to a melting point of a metal forming a wiring layer included in each device.

4. The test wafer using method according to claim 2, wherein said metal foil is formed on the front side of said test substrate so as to have a pattern selected from the group consisting of a dot pattern, lattice pattern, rectangular pattern, and stripe pattern, said metal foil having a melting point lower than or equal to a melting point of a metal forming a wiring layer included in each device.

5. The test wafer using method according to claim 2, further comprising:
    an oxidation preventing film formed on a front side of said metal foil.

6. The test wafer using method according to claim 5, wherein the material of said oxidation preventing film is selected from the group consisting of SiO2, TiO2, Ta2O5, and polyethylene terephthalate.

7. The test wafer using method according to claim 1, wherein the material of said test substrate is selected from the group consisting of Si, SiC, Al2O3, and GaN.

8. A test wafer using method for using a test wafer including a test substrate and a metal foil formed on a front side of said test substrate, wherein said test wafer lacks devices, and instead the metal foil functions as a substitute for devices formed on an actual wafer, said test wafer using method comprising:
    a modified layer forming step of applying a laser beam having a transmission wavelength to said test substrate from a back side of said test wafer in the condition where a focal point of said laser beam is set inside said test substrate, thereby forming a modified layer inside said test substrate;

a damage detecting step of observing the metal foil after performing said modified layer forming step, thereby detecting damage to said metal foil; and a laser processing step of performing laser processing on an actual wafer including devices, wherein the laser processing step is performed under laser processing conditions determined based on the damage detecting step.

* * * * *